United States Patent [19]

Lumsden

[11] Patent Number: 5,227,735
[45] Date of Patent: Jul. 13, 1993

[54] TECHNIQUE TO DRIVE TRANSFORMER COUPLED LINE AMPLIFIER

[75] Inventor: John L. Lumsden, Boca Raton, Fla.

[73] Assignee: Sony Corporation of America, Park Ridge, N.J.

[21] Appl. No.: 823,962

[22] Filed: Jan. 22, 1992

[51] Int. Cl.$^5$ .............................................. H03F 3/68
[52] U.S. Cl. .................................. 330/84; 330/124 R; 381/121
[58] Field of Search .................... 330/84, 99, 100, 101, 330/103, 104, 150, 152, 124 D, 124 R, 195, 196, 197; 381/28, 120, 121

[56] References Cited

U.S. PATENT DOCUMENTS

| | | | |
|---|---|---|---|
| 3,051,788 | 8/1962 | Seeley | 330/124 D |
| 4,088,961 | 5/1978 | Ashley . | |
| 4,532,476 | 7/1985 | Smith . | |

FOREIGN PATENT DOCUMENTS 2629605  1/1978  Fed. Rep. of Germany ...... 381/121
593300  2/1978  U.S.S.R. .

OTHER PUBLICATIONS

Buscher, R. G., "Computers in Audio Design", *Audio*, Mar., 1961 pp. 22-24.

*Primary Examiner*—Steven Mottola
*Attorney, Agent, or Firm*—Ronald P. Kananen

[57] ABSTRACT

The invention relates to a circuit for driving a transformer coupled line amplifier. The present invention uses a high impedance differential negative feedback from the secondary of the transformer and uses positive feedback from the primary winding of the transformer. This enables the transformer to be smaller in size while still reducing the harmonic distortion, improving the frequency response, eliminating ringing, lowering the output impedance, improving the longitudinal balance, and also improving the overall stability and phase response of the transformer.

10 Claims, 1 Drawing Sheet

TECHNIQUE TO DRIVE TRANSFORMER COUPLED LINE AMPLIFIER

FIELD OF THE INVENTION

This invention relates to a technique for driving a transformer and, more particularly, to a circuit in an audio mixer for driving a transformer coupled line amplifier.

BACKGROUND OF INVENTION

In the past, transformers have suffered from harmonic distortion, poor frequency response, and high impedance especially at low frequencies. Previously, this has necessitated the transformer to be physically large. In order to overcome these and other drawbacks of the prior art, the present invention allows a transformer to be smaller and have a much better performance. In particular, the present invention makes use of a high impedance feedback network to generally improve performance while retaining all the advantages of the transformer. More specifically, the present invention includes a secondary high impedance differential negative feedback circuit which is employed from the transformer secondary to the amplifiers. This reduces distortion, improves frequency response, eliminates ringing, lowers output impedance and due to the differential nature of the circuit, greatly improves longitudinal balance. Overall stability and phase response are also improved.

SUMMARY OF THE INVENTION

It is an object of the present invention to provide a transformer which has an improved frequency response and which reduces harmonic distortion.

It is also an object of the present invention to provide a transformer which eliminates ringing, lowers the output impedance and improves longitudinal balance.

It is a further object of the present invention to provide a transformer in which the overall stability and phase response is improved.

It is still a further object of the present invention to provide a transformer and driving circuit which overcome the disadvantages of the prior art without necessitating a larger transformer size.

Additional objects, advantages and novel features of the invention will be set forth in the description which follows, and will become apparent to those skilled in the art upon reading this description or practicing the invention.

To achieve the foregoing and other objects, in accordance with the purpose of the present invention, as embodied and broadly described herein, the differential transformer coupling circuit of this invention may comprise positive feedback from the transformer primary and differential negative feedback from the transformer secondary.

BRIEF DESCRIPTION OF THE DRAWINGS

The accompanying drawing, which is incorporated in, and forms a part of, the specification, illustrates an embodiment of the present invention and, together with the description, serves to explain the principles of the invention.

DETAILED DESCRIPTION OF THE PREFERRED EMBODIMENT

Figure 1:
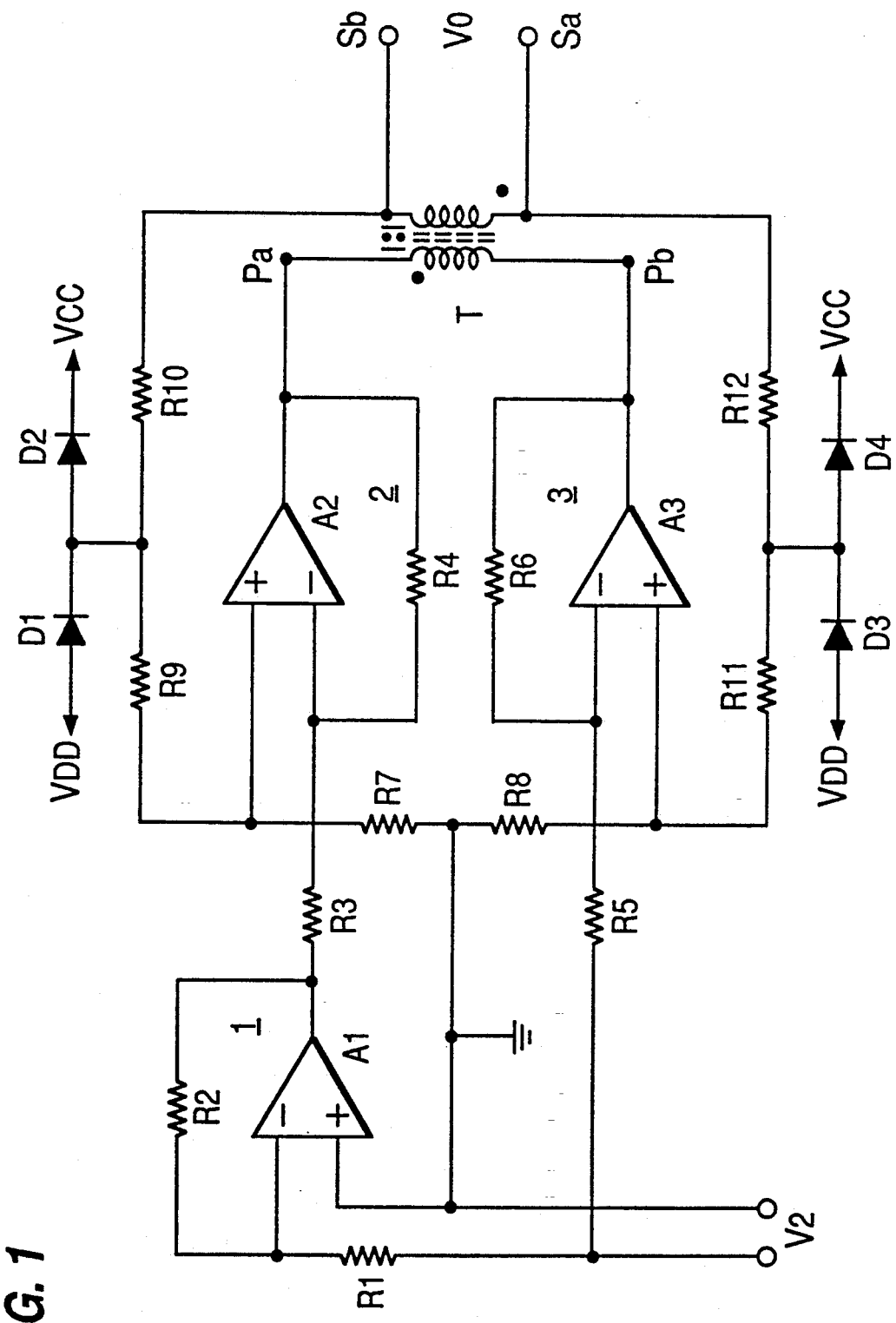
FIG. 1 illustrates a circuit diagram of an embodiment of the invention.

Reference will now be made in detail to the preferred embodiment of the invention, an example of which is illustrated in FIG. 1. FIG. 1 illustrates a technique for driving a transformer which is applicable, for example, in a line output for an audio mixing console.

In FIG. 1, an input signal $V_i$ is supplied to a differential amplifier comprised of op-amp A1 and resistances R2 and R1. The output of the first differential amplifier 1 is supplied to the inverting input of a second differential amplifier 2 comprised of op-amp A2 and resistances R4 and R3.

A third differential amplifier 3 comprises an op-amp A3 and resistances R6 and R5. The outputs of differential amplifiers 2 and 3 are applied to terminals $P_a$ and $P_b$, respectively, to differentially drive the primary winding of the transformer T. The signals applied to the primary winding of the transformer are fed back positively through resistances R4 and R6 to the inverting inputs of op-amps A2 and A3, respectively.

Preferably, voltage source $V_{CC}$ is on the order of 18 volts and voltage source $V_{DD}$ is on the order of $-18$ volts. Voltage source $V_{CC}$ is supplied to the cathodes of diodes D2 and D4 while voltage source $V_{DD}$ is supplied to the anodes of diodes of D1 and D3. The junction of diodes D3 and diode D4 and the junction of diodes D3 and D4 are at a "synthesized" or virtual ground.

A signal from terminal $S_a$ of the secondary winding of transformer T, derived from an output signal $V_o$, is connected to the synthesized ground through resistance R12 and to the non-inverting input of op-amp A3 through resistances R12 and R11. The inverting input of op-amp A3 is supplied with the input signal $V_i$ through resistance R5. Op-amp A3 outputs the difference between the signals derived from the input signal $V_i$ and the output signal $V_o$.

A signal from terminal $S_b$ of the secondary winding of transformer T, derived from the output voltage $V_o$, is supplied through resistance R10 to the synthesized ground and to the non-inverting input of op-amp A2 through resistances R9 and R10. The inverting input of op-amp A2 is supplied with the output of A1 through resistance R3. Op-amp A2 outputs the difference between the signals derived from the output of A1 and the output signal $V_o$.

Preferably, the signals fed back from the secondary winding of the transformer T are in phase with the signals applied to the non-inverting inputs of the op-amps A2 and A3. Thus, the driving circuit receives negative differential feedback from the secondary winding of the transformer.

The above described driving circuit for a transformer having a differential high impedance negative feedback from the secondary winding of the transformer and having positive feedback from the primary winding enables a transformer to be smaller in size while still reducing harmonic distortion, improving frequency response, illuminating ringing, lowering the output impedance, improving the longitudinal balance, and also improving the overall stability and phase response of the transformer.

The foregoing description of a preferred embodiment of the invention has been presented for purposes of illustration and description. It is not intended to be exhaustive or to limit the invention to the precise form disclosed. Many modifications and variations are possible in light of the above teaching. For example, the transformer driving circuit should not be limited to signals having a low or medium frequency. Also, although the driving circuit may be used in a audio mixing console, other applications of the circuit are also possible. The embodiment was chosen and described in order to best explain the principles of the invention and its practical application to thereby enable others skilled in the art to best utilize the invention and various embodiments and with various modifications as are suited to the particular use contemplated. It is intended that the scope of the invention only be limited by the claims appended hereto.

I claim:

1. A circuit for driving a transformer comprising a primary winding and a secondary winding, comprising:
   (a) amplifying means for receiving an input signal, for amplifying said input signal and for producing first and second primary winding input signals which are supplied to said primary winding, said first and second primary winding input signals causing first and second output signals at the secondary winding, said amplifying means including:
      (i) a first differential amplifier which receives said input signal as an input and which produces a third output signal;
      (ii) a second differential amplifier which receives said third output signal as an input and outputs said first primary winding input signal; and
      (iii) a third differential amplifier which receives said input signal as an input and outputs said second primary winding input signal;
   (b) first feedback means for feeding back said first and second primary winding input signals from said primary winding to said amplifying means; and
   (c) second feedback means for feeding back said first and second output signals from said secondary winding to said amplifying means.

2. The circuit as set forth in claim 1, wherein said first feedback means positively feeds back said first primary winding input signal to said input of said second differential amplifier and positively feeds back said second primary winding input signal to said input of said third differential amplifier.

3. The circuit as set forth in claim 1, wherein said second feedback means negatively feeds back said first output signal from said secondary winding to said second differential amplifier and said second output signal to said third differential amplifier.

4. A circuit for driving a transformer having at least a primary winding and a secondary winding, each winding having opposed first and second terminals, comprising:
   an input circuit including an amplifying means for amplifying an input signal to provide an output signal representative of said input signal;
   a first differential amplifier having an inverting terminal in circuit with said input circuit for receiving said output signal, an output of said first differential amplifier connected to a first terminal of said primary winding and to said inverting terminal of said first differential amplifier to provide positive feedback through a first resistor, and a non-inverting terminal of said first differential amplifier receiving negative feedback from a first terminal of said secondary winding; and
   a second differential amplifier having an inverting terminal for receiving said input signal, an output of said second differential amplifier connected to a second terminal of said primary winding and to said inverting terminal f said second differential amplifier to provide positive feedback through a second resistor, and a non-inverting terminal of said second differential amplifier receiving negative feedback from a second terminal of said secondary winding.

5. The circuit as set forth in claim 4, wherein said non-inverting terminal of said first differential amplifier is connected through a third resistor to a first virtual ground, said first terminal of said secondary winding is connected through a fourth resistor to said first virtual ground, said non-inverting terminal of said second differential amplifier is connected through a fifth resistor to a second virtual ground, and said second terminal of said secondary winding is connected to said second virtual ground through a sixth resistor.

6. A circuit for driving a transformer comprising a primary winding and a secondary winding, comprising:
   (a) differential amplifying means having an input for receiving an input signal, for differentially amplifying said input signal and for producing first and second primary winding input signals which are supplied to said primary winding, said first and second primary winding input signals causing first and second output signals at the secondary winding;
   (b) positive feedback means for feeding backs aid first and second primary winding input signals from said primary winding to said differential amplifying means; and
   (c) negative feedback means for feeding back said first and second output signals from said secondary winding to said differential amplifying means.

7. The circuit as set forth in claim 6, wherein said differential amplifying means comprises a first differential amplifier for differentially amplifying said input signal, a second differential amplifier for differentially amplifying an output of said first differential amplifier and for generating said first primary winding input signal, and a third differential amplifier for differentially amplifying said input signal and for generating said second primary winding input signal.

8. The circuit as set forth in claim 7, wherein said first output signal from said secondary winding is negatively fed back through a first resistor to said second differential amplifier and said second output signal from said secondary winding is negatively fed back through a second resistor to said third differential amplifier.

9. The circuit as set forth in claim 7, wherein said first primary winding input signal is positively fed back to said second differential amplifier with said output from said first differential amplifier and said second primary winding input signal is positively fed back to said third differential amplifier with said input signal.

10. The circuit as set forth in claim 9, wherein said second differential amplifier is connected to said first output signal through a first pair of resistors, said third differential amplifier is connected to said second output signal through a second pair of resistors, and wherein a junction of said first pair of resistors and a junction of said second pairs of resistors are respectively connected to first and second virtual grounds.

* * * * *